United States Patent
Lower et al.

(10) Patent No.: US 8,664,047 B2
(45) Date of Patent: Mar. 4, 2014

(54) INTEGRATED CIRCUIT TAMPERING PROTECTION AND REVERSE ENGINEERING PREVENTION COATINGS AND METHODS

(75) Inventors: Nathan P. Lower, North Liberty, IA (US); Alan P. Boone, Swisher, IA (US); Ross K. Wilcoxon, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 13/329,068

(22) Filed: Dec. 16, 2011

(65) Prior Publication Data

US 2012/0088338 A1   Apr. 12, 2012

Related U.S. Application Data

(60) Division of application No. 11/784,932, filed on Apr. 10, 2007, now Pat. No. 8,084,855, which is a continuation-in-part of application No. 11/508,782, filed on Aug. 23, 2006, now Pat. No. 8,076,185.

(51) Int. Cl.
*H01L 23/22* (2006.01)

(52) U.S. Cl.
USPC .............. 438/125; 257/701; 257/E21.501

(58) Field of Classification Search
USPC .............. 438/781, 125; 257/701, E21.501
See application file for complete search history.

(56) References Cited

U.S. PATENT DOCUMENTS

| | | |
|---|---|---|
| 3,508,974 A | 4/1970 | Bressler |
| 3,654,528 A | 4/1972 | Barkan |
| 3,723,790 A | 3/1973 | Dumbaugh et al. |
| 3,812,404 A | 5/1974 | Barkan et al. |
| 4,177,015 A | 12/1979 | Davidson |
| 4,294,658 A | 10/1981 | Humphreys et al. |
| 4,410,874 A | 10/1983 | Scapple et al. |
| 4,505,644 A | 3/1985 | Meisner et al. |
| 4,513,029 A | 4/1985 | Sakai |
| 4,560,084 A | 12/1985 | Wolfson |
| 4,572,924 A | 2/1986 | Wakely et al. |

(Continued)

FOREIGN PATENT DOCUMENTS

| | | |
|---|---|---|
| JP | 55-120083 | 9/1980 |
| JP | 57027942 | 2/1982 |

(Continued)

OTHER PUBLICATIONS

Office Action for U.S. Appl. No. 13/287,734, mail date Apr. 11, 2013, 18 pages.

(Continued)

*Primary Examiner* — Mary Wilczewski
*Assistant Examiner* — Toniae Thomas
(74) *Attorney, Agent, or Firm* — Donna P. Suchy; Daniel M. Barbieri

(57) ABSTRACT

A method of protecting an electronics package is discussed along with devices formed by the method. The method involves providing at least one electronic component that requires protecting from tampering and/or reverse engineering. Further, the method includes mixing into a liquid glass material at least one of high durability micro-particles or high-durability nano-particles, to form a coating material. Further still, the method includes depositing the coating material onto the electronic component and curing the coating material deposited.

20 Claims, 9 Drawing Sheets

(56) References Cited

U.S. PATENT DOCUMENTS

| | | | |
|---|---|---|---|
| 4,622,433 A | 11/1986 | Frampton | |
| 4,761,518 A | 8/1988 | Butt et al. | |
| 4,765,948 A | 8/1988 | DeLuca et al. | |
| 4,773,826 A | 9/1988 | Mole | |
| 4,802,531 A | 2/1989 | Nathenson et al. | |
| 4,882,212 A | 11/1989 | SinghDeo et al. | |
| 4,963,503 A | 10/1990 | Aoki et al. | |
| 5,041,342 A | 8/1991 | Umeda et al. | |
| 5,136,365 A | 8/1992 | Pennisi et al. | |
| 5,140,109 A | 8/1992 | Matsumoto et al. | |
| 5,184,211 A | 2/1993 | Fox | |
| 5,195,231 A | 3/1993 | Fanning et al. | |
| 5,232,970 A | 8/1993 | Solc et al. | |
| 5,244,726 A | 9/1993 | Laney et al. | |
| 5,265,136 A | 11/1993 | Yamazaki et al. | |
| 5,288,769 A | 2/1994 | Papageorge et al. | |
| 5,315,155 A | 5/1994 | O'Donnelly et al. | |
| 5,405,808 A | 4/1995 | Rostoker et al. | |
| 5,502,889 A | 4/1996 | Casson et al. | |
| 5,581,286 A | 12/1996 | Hayes et al. | |
| 5,686,703 A | 11/1997 | Yamaguchi | |
| 5,690,837 A | 11/1997 | Nakaso et al. | |
| 5,702,963 A | 12/1997 | Vu et al. | |
| 5,863,605 A | 1/1999 | Bak-Boychuk et al. | |
| 5,916,944 A | 6/1999 | Camilletti et al. | |
| 5,958,794 A | 9/1999 | Bruxvoort et al. | |
| 5,965,947 A | 10/1999 | Nam et al. | |
| 5,991,351 A | 11/1999 | Woolley | |
| 6,010,956 A | 1/2000 | Takiguchi et al. | |
| 6,019,165 A | 2/2000 | Batchelder | |
| 6,021,844 A | 2/2000 | Batchelder | |
| 6,027,791 A | 2/2000 | Higashi et al. | |
| 6,028,619 A | 2/2000 | Saita et al. | |
| 6,039,896 A | 3/2000 | Miyamoto et al. | |
| 6,048,656 A | 4/2000 | Akram et al. | |
| 6,087,018 A | 7/2000 | Uchiyama | |
| 6,110,656 A | 8/2000 | Eichorst et al. | |
| 6,121,175 A | 9/2000 | Drescher et al. | |
| 6,124,224 A | 9/2000 | Sridharan et al. | |
| 6,159,910 A | 12/2000 | Shimizu et al. | |
| 6,356,334 B1 | 3/2002 | Mathew et al. | |
| 6,370,015 B2 | 4/2002 | Noda et al. | |
| 6,423,415 B1 | 7/2002 | Greene et al. | |
| 6,451,283 B1 | 9/2002 | Kuznicki et al. | |
| 6,452,090 B2 | 9/2002 | Takato et al. | |
| 6,486,087 B1 | 11/2002 | Saling et al. | |
| 6,496,359 B2 | 12/2002 | Clark et al. | |
| 6,541,083 B1 | 4/2003 | Landa et al. | |
| 6,541,832 B2 | 4/2003 | Coyle | |
| 6,586,087 B2 | 7/2003 | Young | |
| 6,599,643 B2 | 7/2003 | Heimann et al. | |
| 6,617,041 B2 | 9/2003 | Hahn et al. | |
| 6,624,276 B2 | 9/2003 | Lamers et al. | |
| 6,658,861 B1 | 12/2003 | Ghoshal et al. | |
| 6,663,793 B2 | 12/2003 | Parkhill et al. | |
| 6,664,567 B2 | 12/2003 | Kyoda et al. | |
| 6,665,186 B1 | 12/2003 | Calmidi et al. | |
| 6,708,501 B1 | 3/2004 | Ghoshal et al. | |
| 6,798,072 B2 | 9/2004 | Kajiwara et al. | |
| 6,800,326 B1 | 10/2004 | Uchiyama | |
| 6,800,330 B2 | 10/2004 | Hayashi et al. | |
| 6,918,984 B2 | 7/2005 | Murray et al. | |
| 6,960,878 B2 | 11/2005 | Sakano et al. | |
| 6,986,859 B2 | 1/2006 | Mazany et al. | |
| 7,045,905 B2 | 5/2006 | Nakashima | |
| 7,078,263 B2 | 7/2006 | Dean | |
| 7,114,251 B2 | 10/2006 | Mashino | |
| 7,131,286 B2 | 11/2006 | Ghoshal et al. | |
| 7,175,937 B2 | 2/2007 | Cho et al. | |
| 7,176,564 B2 | 2/2007 | Kim | |
| 7,202,598 B2 | 4/2007 | Juestel et al. | |
| 7,265,977 B2 | 9/2007 | Martin et al. | |
| 7,293,416 B2 | 11/2007 | Ghoshal | |
| 7,296,417 B2 | 11/2007 | Ghoshal | |
| 7,297,206 B2 | 11/2007 | Naruse et al. | |
| 7,307,286 B2 | 12/2007 | Ito et al. | |
| 7,327,039 B2 | 2/2008 | Charles et al. | |
| 7,340,904 B2 | 3/2008 | Sauciuc et al. | |
| 7,342,787 B1 | 3/2008 | Bhatia | |
| 7,348,665 B2 | 3/2008 | Sauciuc et al. | |
| 7,365,984 B2 | 4/2008 | Jeong | |
| 7,391,060 B2 | 6/2008 | Oshio | |
| 7,441,087 B2 | 10/2008 | Hakura et al. | |
| 7,473,460 B2 | 1/2009 | Meguro et al. | |
| 7,476,981 B2 | 1/2009 | Bergmann et al. | |
| 7,491,431 B2 | 2/2009 | Chiruvolu et al. | |
| 7,497,961 B2 | 3/2009 | Keenan et al. | |
| 7,651,556 B2 | 1/2010 | Komiyama et al. | |
| 7,671,468 B2 | 3/2010 | Kanazawa et al. | |
| 7,692,259 B2 | 4/2010 | Suehiro | |
| 7,709,093 B2 | 5/2010 | Makowski et al. | |
| 7,737,356 B2 | 6/2010 | Goldstein | |
| 7,910,403 B2 | 3/2011 | Hirano et al. | |
| 7,915,527 B1 | 3/2011 | Lower et al. | |
| 8,075,185 B2 | 12/2011 | Hecht et al. | |
| 8,076,185 B1 | 12/2011 | Lower et al. | |
| 8,084,855 B2 | 12/2011 | Lower et al. | |
| 8,119,040 B2 | 2/2012 | Lower et al. | |
| 8,174,830 B2 | 5/2012 | Lower et al. | |
| 2001/0015443 A1 | 8/2001 | Komoto | |
| 2001/0030493 A1 | 10/2001 | Noda et al. | |
| 2001/0046933 A1 | 11/2001 | Parkhill et al. | |
| 2002/0000630 A1 | 1/2002 | Coyle | |
| 2002/0054976 A1 | 5/2002 | Nakamura et al. | |
| 2002/0076192 A1 | 6/2002 | Bartholomew et al. | |
| 2002/0078856 A1 | 6/2002 | Hahn et al. | |
| 2002/0086115 A1 | 7/2002 | Lamers et al. | |
| 2002/0170173 A1 | 11/2002 | Mashino | |
| 2002/0189495 A1 | 12/2002 | Hayashi et al. | |
| 2002/0189894 A1 | 12/2002 | Davis et al. | |
| 2003/0047735 A1 | 3/2003 | Kyoda et al. | |
| 2003/0080341 A1 | 5/2003 | Sakano et al. | |
| 2003/0218258 A1 | 11/2003 | Charles et al. | |
| 2003/0228424 A1 | 12/2003 | Dove et al. | |
| 2004/0106037 A1 | 6/2004 | Cho et al. | |
| 2004/0116577 A1 | 6/2004 | Naruse et al. | |
| 2004/0156995 A1 | 8/2004 | Komiyama et al. | |
| 2004/0194667 A1 | 10/2004 | Reuscher | |
| 2005/0003947 A1 | 1/2005 | Mazany et al. | |
| 2005/0082691 A1 | 4/2005 | Ito et al. | |
| 2005/0099775 A1 | 5/2005 | Pokharna et al. | |
| 2005/0116237 A1 | 6/2005 | Voutsas | |
| 2005/0123684 A1 | 6/2005 | Makowski et al. | |
| 2005/0179742 A1 | 8/2005 | Keenan et al. | |
| 2006/0045755 A1 | 3/2006 | McDonald et al. | |
| 2006/0068218 A1 | 3/2006 | Hooghan et al. | |
| 2006/0095677 A1 | 5/2006 | Hakura et al. | |
| 2006/0135342 A1 | 6/2006 | Anderson et al. | |
| 2006/0154004 A1* | 7/2006 | Hayashi et al. | 428/32.34 |
| 2006/0158849 A1 | 7/2006 | Martin et al. | |
| 2006/0250731 A1 | 11/2006 | Parkhurst et al. | |
| 2006/0268525 A1 | 11/2006 | Jeong | |
| 2006/0283546 A1 | 12/2006 | Tremel et al. | |
| 2007/0075323 A1 | 4/2007 | Kanazawa et al. | |
| 2007/0102833 A1 | 5/2007 | Hack et al. | |
| 2007/0108586 A1 | 5/2007 | Uematsu et al. | |
| 2007/0224400 A1 | 9/2007 | Meguro et al. | |
| 2008/0006204 A1 | 1/2008 | Rusinko et al. | |
| 2008/0050512 A1 | 2/2008 | Lower et al. | |
| 2008/0063875 A1 | 3/2008 | Robinson et al. | |
| 2008/0142966 A1 | 6/2008 | Hirano et al. | |
| 2008/0299300 A1 | 12/2008 | Wilcoxon et al. | |
| 2009/0110904 A1 | 4/2009 | Mack et al. | |
| 2009/0183774 A1 | 7/2009 | Atanackovic | |
| 2009/0246355 A9 | 10/2009 | Lower et al. | |
| 2009/0279257 A1 | 11/2009 | Lower et al. | |
| 2012/0118623 A1 | 5/2012 | Lower et al. | |

FOREIGN PATENT DOCUMENTS

| | | |
|---|---|---|
| JP | 60013875 | 1/1985 |
| JP | 02064071 | 3/1990 |
| JP | 11-095246 | 4/1994 |

(56) References Cited

FOREIGN PATENT DOCUMENTS

| | | |
|---|---|---|
| JP | 2003332505 | 11/2003 |
| JP | 2006045420 | 2/2006 |
| WO | WO2006/095677 | 9/2006 |

OTHER PUBLICATIONS

Office Action for U.S. Appl. No. 11/959,225, mail date Apr. 23, 2013, 6 pages.
Office Action for U.S. Appl. No. 12/240,775, mail date Apr. 2, 2012, 8 pages.
Office Action for U.S. Appl. No. 11/732,982, mail date Apr. 16, 2012, 15 pages.
Office Action for U.S. Appl. No. 11/959,225, mail date Apr. 25, 2012, 17 pages.
Office Action for U.S. Appl. No. 12/493,022, mail date May 30, 2012, 13 pages.
Office Action for U.S. Appl. No. 11/732,982, mail date Jul. 3, 2012, 15 pages.
Notice of Allowance for U.S. Appl. No. 12/493,022, mail date Sep. 20, 2012, 5 pages.
Notice of Allowance for U.S. Appl. No. 11/732,982, mail date Nov. 8, 2012, 8 pages.
Office Action for U.S. Appl. No. 13/359,105, mail date May 8, 2012, 12 pages.
Office Action for U.S. Appl. No. 12/240,775, mail date Sep. 6, 2012, 9 pages.
Office Action for U.S. Appl. No. 11/959,225, mail date Sep. 25, 2012, 16 pages.
Office Action for U.S. Appl. No. 13/359,105, mail date Oct. 19, 2012, 7 pages.
U.S. Appl. No. 11/732,982, filed Apr. 5, 2007, Boone et al.
U.S. Appl. No. 11/959,225, filed Dec. 18, 2007, Lower et al.
Click et al., Schott Low Temperature Bonding for Precision Optics, http://www.optics.nasa.gov/tech_days/tech_days_2004/docs/18%20Aug%202004/23%20Schott%20Low%20Temperature%20Bonding, 20 pages.
Golubev et al., Modeling of Acid-Base Properties of Binary Alkali-Silicate Melts, Rev. Adv. Mater. Sci. 6, http://www.ipme.ru/e-journals/RAMS/no_1604/golubev/golubev. (2004), 8 pages.
Kennedy, Strength and Fracture Toughness of Binary Alkali Silicate Glasses (Abstract only), http://www.oai.dtic.mil/oai/oai?verb=getRecord&metadataPrefix=html&identifier=ADA016820, Feb. 14, 1974, 1 page.
Lewis et al., Direct Writing in Three Dimension, Materialstoday, Jul./Aug. 2004, 8 pages.
Mysen et al., Properties and Structure (Developments in Geochemistry), Silicate Glasses and Melts, vol. 10, http://www.amazon.com/Silicate-Glasses-Melts-Developments-Geochemistry/dp/0444520112, 4 pages.
Nascimento et al., Universal Curve of Ionic Conductivities in Binary Alkali Silicate Glasses, http://www.springerlink.com/content/p7535075x1872016/, Journal of Materials Science (2005), 3 pages.
Optomec® Systems M3D® Breakthrough Technology for Printable Electronics, 2 pages.
Pedone et al., Insight into Elastic Properties of Binary Alkali Silicate Glasses; Prediction and Interpretation through Atomistic Simulation Techniques, http://pubs.acs.org/doi/abs/10.1021/cm062619r, Chemistry of Materials, 2007, 2 pages.
PQ Corporation, Bonding and Coating Applications of PQ® Soluble Silicates, Bulletin 12-31, (2003) 1 page.
PQ Corporation, PQ® Soluble Silicates in Refractory and Chemical-Resistant Cements, Bulletin 24-1, (2003), 1 page.
Shermer, Thermal Expansion of Binary Alkali Silicate Glasses, http://nvl.nist.gov/pub/nistpubs/jres/057/2A/57.N02.A05, Journal of Research of the National Bureau of Standards, Aug. 1956, Research Paper No. 2698, 5 pages.
The Mixed-Alkali Effect for the Viscosity of Glasses, http://glassproperties.com/viscosity/mixed-alkali-effect-viscosity/, 7 pages.
The Structure of Glasses. Alkali silicate glasses, printed on Dec. 3, 2010 from website: http://www.ptc.tugraz.at/specmag/struct/ss.htm, 1 page.
Thresh, The Action of Natural Waters on Lead, The Analyst, Proceedings of the Society of Public Analysts and Other Analytical Chemists, Nov. 1922, pp. 459-468, vol. XLVII, No. 560.
International Search Report and Written Opinion for International Application No. PCT/US2008/074224, mail date Jan. 30, 2009, 9 pages.
International Search Report and Written Opinion for International Application No. PCT/US2008/075591, mail date Apr. 8, 2009, 7 pages.
International Search Report and Written Opinion for Application No. PCT/US2009/036355, mail date Jun. 30, 2009, 11 pages.
International Search Report and Written Opinion for Application No. PCT/US2009/031699, mail date Aug. 18, 2009, 16 pages.
Office Action for U.S. Appl. No. 11/508,782, mail date Dec. 24, 2008, 9 pages.
Office Action for U.S. Appl. No. 11/508,782, mail date Jun. 16, 2009, 13 pages.
Advisory Action received for U.S. Appl. No. 11/508,782, mail date Aug. 31, 2009, 3 pages.
Response for U.S. Appl. No. 11/508,782, mail date Nov. 13, 2009, 14 pages.
Office Action for U.S. Appl. No. 11/508,782, mail date Feb. 24, 2010, 12 pages.
Advisory Action and Examiner Interview Summary for U.S. Appl. No. 11/508,782, mail date Nov. 23, 2010, 5 pages.
Examiner Interview Summary for U.S. Appl. No. 11/508,782, mail date Jan. 5, 2011, 2 pages.
Office Action for U.S. Appl. No. 11/508,782, mail date Jan. 19, 2011, 9 pages.
Notice of Allowance for U.S. Appl. No. 11/508,782, mail date May 31, 2011, 9 pages.
Notice of Allowance for U.S. Appl. No. 11/508,782, mail date Jul. 26, 2011, 4 pages.
Office Action for U.S. Appl. No. 11/784,158, mail date Apr. 21, 2009, 10 pages.
Response for U.S. Appl. No. 11/784,158, mail date Jan. 8, 2010, 10 pages.
Office Action for U.S. Appl. No. 11/784,158, mail date Mar. 26, 2010, 7 pages.
Amendment and Reply for U.S. Appl. No. 11/784,158, mail date May 26, 2010, 12 pages.
Office Action for U.S. Appl. No. 11/784,158, mail date Jun. 17, 2010, 6 pages.
Notice of Allowance for U.S. Appl. No. 11/784,158, mail date Nov. 29, 2010, 4 pages.
Office Action for U.S. Appl. No. 11/732,981, mail date Oct. 6, 2010, 9 pages.
Office Action for U.S. Appl. No. 11/732,981, mail date Mar. 16, 2011, 7 pages.
Notice of Allowance for U.S. Appl. No. 11/732,981, mail date Jul. 26, 2011, 7 pages.
Notice of Allowance for U.S. Appl. No. 11/784,932, mail date Aug. 23, 2011, 8 pages.
Notice of Allowance for U.S. Appl. No. 11/784,932, mail date May 12, 2011, 6 pages.
Office Action for U.S. Appl. No. 11/784,932, mail date Apr. 3, 2009, 8 pages.
Office Action for U.S. Appl. No. 11/784,932, mail date Feb. 16, 2010, 10 pages.
Office Action for U.S. Appl. No. 11/784,932, mail date Nov. 10, 2010, 9 pages.
Request for Continued Examination for U.S. Appl. No. 11/784,932, mail date Aug. 10, 2011, 6 pages.
Response for U.S. Appl. No. 11/784,932, mail date Jul. 2, 2009, 8 pages.
Office Action for U.S. Appl. No. 12/284,670, mail date Sep. 28, 2010, 10 pages.
Office Action for U.S. Appl. No. 12/284,670, mail date Feb. 17, 2011, 12 pages.

(56) References Cited

OTHER PUBLICATIONS

Notice of Allowance for U.S. Appl. No. 12/284,670, mail date May 11, 2011, 7 pages.
Office Action for U.S. Appl. No. 12/286,207, mail date Dec. 27, 2010, 14 pages.
Notice of Allowance for U.S. Appl. No. 12/286,207, mail date Jun. 27, 2011, 12 pages.
Office Action for U.S. Appl. No. 11/732,982, mail date Feb. 2, 2011, 15 pages.
Office Action for U.S. Appl. No. 11/732,982, mail date Jun. 21, 2011, 14 pages.
Office Action for U.S. Appl. No. 11/959,225, mail date Jul. 22, 2009, 10 pages.
Response for U.S. Appl. No. 11/959,225, mail date Mar. 2, 2010, 9 pages.
Office Action for U.S. Appl. No. 11/959,225, mail date Oct. 27, 2010, 11 pages.
Office Action for U.S. Appl. No. 11/959,225, mail date Apr. 13, 2011, 16 pages.
Office Action for U.S. Appl. No. 12/116,126, mail date Nov. 20, 2009, 7 pages.
Response for U.S. Appl. No. 12/116,126, mail date Feb. 22, 2010, 10 pages.
Office Action for U.S. Appl. No. 12/116,126, mail date Apr. 22, 2010, 7 pages.
Office Action for U.S. Appl. No. 12/116,126, mail date Oct. 25, 2010, 8 pages.
Office Action for U.S. Appl. No. 12/116,126, mail date Feb. 25, 2011, 9 pages.
Office Action for U.S. Appl. No. 12/116,126, mail date May 10, 2011, 8 pages.
Office Action for U.S. Appl. No. 12/240,775, mail date May 26, 2011, 9 pages.
Advisory Action for U.S. Appl. No. 11/959,225, mail date Jul. 31, 2012, 3 pages.
Advisory Action for U.S. Appl. No. 12/116,126, mail date Jun. 29, 2010, 4 pages.
Advisory Action for U.S. Appl. No. 12/240,775, mail date Nov. 14, 2012, 2 pages.
Amendment and Reply for U.S. Appl. No. 12/116,126, mail date Jul. 22, 2010, 9 pages.
Amendment and Reply for U.S. Appl. No. 11/732,981, mail date Jan. 6, 2011, 9 pages.
Amendment and Reply for U.S. Appl. No. 11/732,982, mail date Jun. 14, 2012, 11 pages.
Amendment and Reply for U.S. Appl. No. 11/732,982, mail date May 2, 2011, 12 pages.
Amendment and Reply for U.S. Appl. No. 11/732,982, mail date Oct. 25, 2010, 6 pages.
Amendment and Reply for U.S. Appl. No. 11/732,982, mail date Sep. 28, 2012, 7 pages.
Amendment and Reply for U.S. Appl. No. 11/784,158, mail date Jul. 21, 2009, 10 pages.
Amendment and Reply for U.S. Appl. No. 11/784,932, mail date Jun. 14, 2010, 9 pages.
Amendment and Reply for U.S. Appl. No. 11/959,225, mail date Aug. 24, 2009, 2 pages.
Amendment and Reply for U.S. Appl. No. 11/959,225, mail date Aug. 26, 2010, 11 pages.
Amendment and Reply for U.S. Appl. No. 11/959,225, mail date Feb. 15, 2012, 15 pages.
Amendment and Reply for U.S. Appl. No. 11/959,225, mail date Jul. 5, 2011, 6 pages.
Amendment and Reply for U.S. Appl. No. 11/959,225, mail date Jun. 25, 2012, 14 pages.
Amendment and Reply for U.S. Appl. No. 12/116,126, mail date Apr. 29, 2011, 9 pages.
Amendment and Reply for U.S. Appl. No. 12/116,126, mail date Jan. 25, 2011, 8 pages.
Amendment and Reply for U.S. Appl. No. 12/116,126, mail date Jun. 22, 2010, 7 pages.
Amendment and Reply for U.S. Appl. No. 12/240,775, mail date Jul. 2, 2012, 12 pages.
Amendment and Reply for U.S. Appl. No. 12/240,775, mail date Nov. 6, 2012, 8 pages.
Amendment and Reply for U.S. Appl. No. 12/284,670, mail date Apr. 18, 2011, 9 pages.
Amendment and Reply for U.S. Appl. No. 12/286,207, mail date Mar. 28, 2011, 12 pages.
Amendment and Reply for U.S. Appl. No. 12/493,022, mail date Aug. 28, 2012, 7 pages.
Amendment and Reply for U.S. Appl. No. 12/493,022, mail date Mar. 23, 2012, 3 pages.
Amendment and Reply for U.S. Appl. No. 13/359,105, mail date Aug. 8, 2012, 10 pages.
Notice of Allowance for U.S. Appl. No. 11/732,982, mail date Dec. 19, 2012, 2 pages.
Office Action for U.S. Appl. No. 13/359,105, mail date Jan. 17, 2013, 7 pages.
Request for Continued Examination for U.S. Appl. No. 11/784,932, mail date Jun. 14, 2010, 4 pages.
Request for Continued Examination for U.S. Appl. No. 11/959,225, mail date Aug. 27, 2012, 19 pages.
Request for Continued Examination for U.S. Appl. No. 12/116,126, mail date Apr. 29, 2011, 4 pages.
Request for Continued Examination for U.S. Appl. No. 12/116,126, mail date Jul. 22, 2010, 4 pages.
Request for Continued Examination for U.S. Appl. No. 12/286,207, mail date Sep. 26, 2011, 4 pages.
Restriction Requirement for U.S. Appl. No. 11/732,982, mail date Sep. 24, 2010, 5 pages.
Restriction Requirement for U.S. Appl. No. 12/493,022, mail date Feb. 22, 2012, 6 pages.
Amendment and Reply for U.S. Appl. No. 11/959,225, mail date Jul. 22, 2013, 7 pages.
Amendment and Reply for U.S. Appl. No. 13/287,734, mail date Jul. 9, 2013, 10 pages.
Notice of Allowance for U.S. Appl. No. 11/732,982, mail date Jul. 10, 2013, 6 pages.
Notice of Allowance for U.S. Appl. No. 13/359,105, mail date Jun. 24, 2013, 9 pages.

* cited by examiner

REACTION OF SILICA ONTO METAL,
GLASS, OR CERAMIC SURFACE.

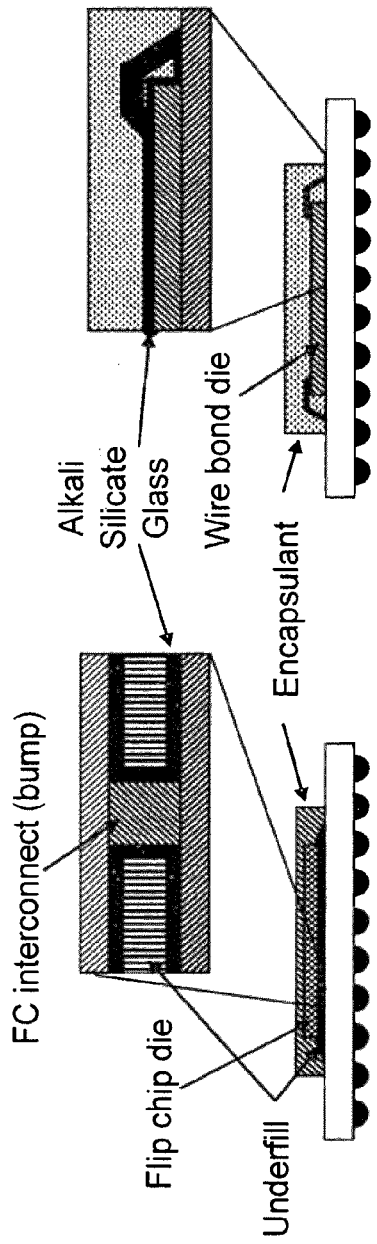
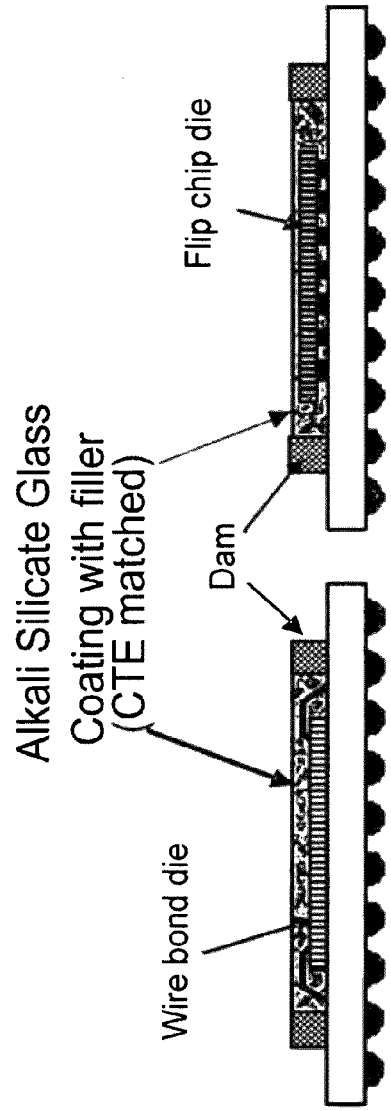
FIG. 3
FIG. 4

INTEGRATED CIRCUIT TAMPERING PROTECTION AND REVERSE ENGINEERING PREVENTION COATINGS AND METHODS

CROSS REFERENCE TO RELATED APPLICATIONS

This application is a divisional application of U.S. application Ser. No. 11/784,932 by Lower et al. filed on Apr. 10, 2007, entitled INTEGRATED CIRCUIT TAMPERING PROTECTION AND REVERSED ENGINEERING PREVENTION COATINGS AND METHODS, which is a continuation-in-part of U.S. application Ser. No. 11/508,782, entitled INTEGRATED CIRCUIT PROTECTION AND RUGGEDIZATION COATINGS AND METHODS by Lower et al.; filed on Aug. 23, 2006, each of which is incorporated by reference in its entirety.

BACKGROUND

The invention generally relates to applications of coatings for integrated circuits or other electronics packages. The invention also relates generally to methods of using such coatings to prevent reverse engineering of integrated circuits and other electronics packages.

Conventionally, integrated circuits are designed for use in relatively benign environments such as desktop PC's, cell phones, and the like. When these integrated circuit technologies are used in more demanding environments such as avionics they may experience excessively high failure rates due to the higher operating temperature, corrosion, etc. In addition, due to the sensitive nature of the information that may be stored on these components, it may be necessary to protect these devices from reverse engineering in the event that a system containing them were to fall into unfriendly hands. Modifying integrated circuits to improve their thermal performance, corrosion resistance, and tamper resistance is typically very expensive and can be detrimental to reliability.

Therefore, what is needed is a low-cost, simple method for making commercial integrated circuits resistant to tampering and reverse engineering. Further, what is needed is a low-cost simple method whereby reverse engineering of proprietary or secretive circuits or electronics packages is rendered difficult, impossible or nearly impossible by a coating applied to the circuit or electronics package.

The techniques herein below extend to those embodiments which fall within the scope of the appended claims, regardless of whether they accomplish one or more of the above-mentioned needs.

SUMMARY

What is provided is a method of protecting an electronics package. The method includes providing at least one electronic component. The method also includes the use of a low temperature curing alkali silicate (liquid glass) solution. Further, the method includes mixing into the alkali silicate material at least one of high durability micro-particles or high-durability nano-particles, to form a coating material. Further still, the method includes depositing the coating material onto the electronic component. Yet further still, the method includes curing the coating material deposited.

What is also provided is a method of forming a protected electronics package. The method includes providing at least one electronic component. The method also includes the use of an alkali silicate material. Further, the method includes mixing into the alkalai silicate material at least one of high durability micro-particles or high-durability nano-particles, to form a coating material. Further still, the method includes depositing the coating material onto the electronic component. Yet further still, the method includes curing the alkali silicate material to form a coated electronics package. The coated electronics package resists tampering and reverse engineering of the electronic component.

What is also provided is an electronics device. The electronic device includes a substrate and at least one electronic component coupled to the substrate. The electronic device also includes a low curing temperature glass coating encasing at least a portion of at least one electronic component. The low curing temperature glass coating including at least one of high durability micro-particles or high-durability nano-particles.

Alternative exemplary embodiments relate to other features and combination of features as may be generally recited in the claims.

BRIEF DESCRIPTION OF THE DRAWINGS

A better understanding of the features and advantages of the present invention will be obtained by reference to the following detailed description that sets forth illustrative embodiments by way of example only, in which the principles of the invention are utilized, and the accompanying drawings, of which:

FIGS. 3-8 depict exemplary embodiments of various coating configurations for microelectronic packages.

DETAILED DESCRIPTION

Figure 1:
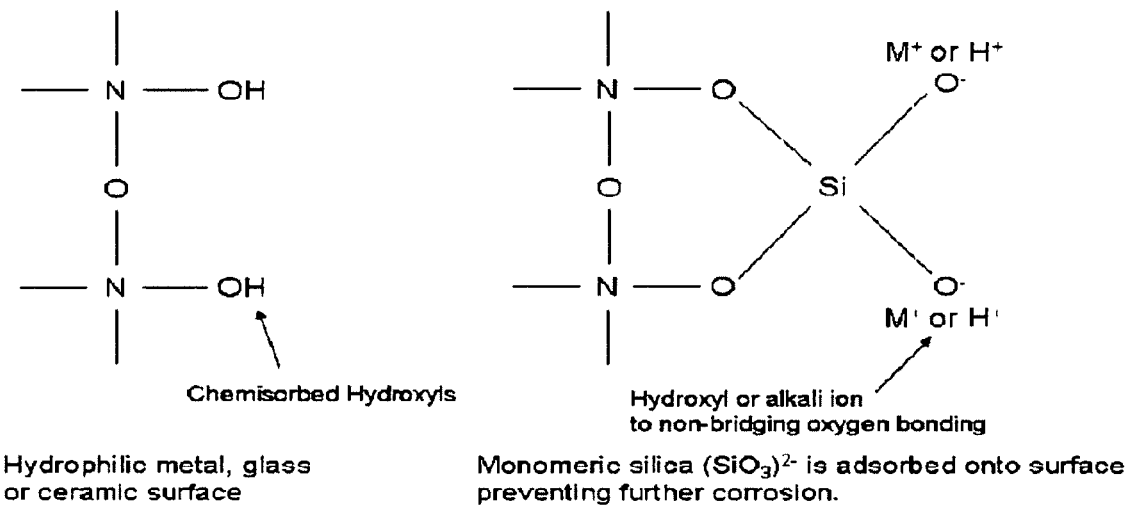
FIG. 1 is an exemplary embodiment of the reaction of silica onto metal, glass, or ceramic surfaces.

Before describing in detail the particular improved system and method, it should be observed that the invention includes, but is not limited to a novel structural combination of conventional data/signal processing components and communications circuits, and not in the particular detailed configurations thereof. Accordingly, the structure, methods, functions, control and arrangement of conventional components and circuits have, for the most part, been illustrated in the drawings by readily understandable block representations and schematic diagrams, in order not to obscure the disclosure with structural details which will be readily apparent to those skilled in the art, having the benefit of the description herein. Further, the invention is not limited to the particular embodiments depicted in the exemplary diagrams, but should be construed in accordance with the language in the claims.

In accordance with an exemplary embodiment, low processing temperature hermetic glass coatings for microelectronics packaging are desirable for hermetically sealing the packaging as well as providing resistance to any one or any combination of tampering, reverse engineering, corrosion and high temperature. These glass coatings are applied and cured at low temperatures, typically around or below 120° C. and produce tightly adhering hermetic (water impermeable) coatings capable of withstanding very high temperatures, theoretically up to ~700° C. These glass coatings may be composed of alkali silicate glass with nanoparticle and or microparticle modifiers, including, but not limited to, alkaline earth carbonates or oxides, metal oxides, rare-earth metal oxides, and non-metal oxides. Aqueous alkali silicate composite solutions applied on or between surfaces of materials, dry to form tough, tightly adhering inorganic bonds that exhibit many desirable characteristics.

Other particles such as but not limited to diamond, aluminum nitride, and other inorganics may also be combined with aqueous alkali silicate based solutions and cured to form very hard and durable composites. Varying combination and concentrations of the various particles allows the production of composites with specific thermal expansion, durability, and adhesion properties. These composites have been shown to bond very well to integrated circuit materials, including but not limited to silicon, silica, silicon nitride, metals, and other inorganics. These alkali silicate glass coatings are very hard and corrosion resistant, making them extremely difficult to remove. Accordingly, it is desirable to add micro- and nanoparticles to create a very hard glass composite coating that is difficult, impossible, or nearly impossible to mechanically remove without damaging the underlying integrated circuit. Therefore, many applications exist for utilizing these composites for reverse engineering protection of integrated circuits and/or electronics packages.

In accordance with exemplary embodiments, the micro- or nano-particles may include but are not limited to those mentioned above as well as boron nitride, silicon carbide, high durability ceramics, non-metallics, different types of glass particles. When these or other durable, high hardness particles are added to the glass, the coating becomes exceptionally durable. Without the particles in the coating the coating may be potentially etched away. The addition of the particles can provide near the durability of the particles in the coating.

Generally, alkali silicate glasses are produced by fusing varying portions of sand ($SiO_2$) and alkali metal carbonate ($M_2CO_3$) or oxide ($M_2O$), at high temperatures, between 1000-1500° C. The resulting product, upon cooling from its molten state, is an amorphous glass that can, under the appropriate processing conditions (temperature and pressure), be dissolved into water to produce liquid alkali silicate solutions. The solution can be further modified by the addition of metal hydroxides and or silica. In accordance with an exemplary embodiment the glass solutions may be mixed with deionized water. The proportion of $SiO_2$ to $M_2O$ is typically defined as the weight ratio. The solution viscosity can be controlled by the concentration of water.

Alkali silicates, in general, are economical, environmentally friendly chemicals which have been used to protect a variety of materials from the corrosive effects of water. These chemicals are classified as corrosion inhibitors because they can deposit protective silicate rich films, isolating materials from corrosive attack. Additionally, they raise the pH of water which can make it less corrosive to metals. Studies have shown that alkali silicates are reactive with cationic metals and metal surfaces. This is the basis by which silicates inhibit corrosion, as illustrated in FIG. 1. Although alkali silicates have been used to protect materials from corrosion, alkali silicates have not been applied to protecting microelectronics, because in standard, off the shelf configuration, they may not cure appropriately and may not exhibit resultant properties which are desirable for protecting microelectronics in harsh environments.

Liquid alkali silicate solutions are commercially available in a variety of $SiO_2/M_2O$ ratios. Typically, ratios of 3.25 down to 1 are readily available in aqueous or powder form. Highly siliceous liquid alkali silicate solutions tend to air dry rapidly, are the most refractory (high melting temperature), and are the most resistant to acids and corrosion. These silica rich liquid solutions tend to contain more water than the alkaline rich solutions (per similar viscosity), and thus undergo greater shrinkage while curing. Low ratio, alkaline rich, solutions tend to have greater elasticity, lower brittleness, and less shrinkage but may exhibit poor corrosion resistance. These low ratio coatings also dry more slowly because their alkali content creates a greater affinity for water. Many chemically resistant cements and mortars are produced using high ratio (N~3.25) alkali silicate solutions. In order for the silicate coatings to become impermeable and relatively insoluble, water must be completely removed. Air drying alone is usually not adequate for coatings which will be exposed to weather or high moisture environments. For these applications heat curing is often needed. Curing temperatures between 95 and 120° C. are often sufficient for adequate dehydration.

It may be desirable to use highly corrosion resistant coatings in microelectronics packaging. While off-the-shelf alkali silicate solutions applied and processed in an appropriate manner could potentially provide a temporary hermetic barrier for microelectronic devices, they may not hold up in harsh testing environments, such as those produced during Highly Accelerated Stress Testing (HAST). In order to produce highly corrosion resistant coatings, modifiers must be added to the base alkali silicate solutions. Studies have shown that adding colloidal silicon dioxide to liquid alkali silicates can produce coatings that are comparable to that of current chromium based passivation, as characterized by salt spray testing. The purpose of these coatings is to protect steel and other metals from environmental corrosion. While a broad range of alkali silicate compositions may be used, highly silica rich coatings ($R \geq 3.25$) are the most corrosion resistant. These high ratio solutions can be made by adding additional $SiO_2$ to the base alkali silicate. However, these silica rich coatings can crack during the curing process. This cracking may be avoided by applying the appropriate solution mixture, thickness, and using an appropriate curing process, all of which may be application specific. Successful silicate rich coatings ($R \geq 4$) have been applied to the surfaces of silicon die and other inorganic substrates, which can be cured quickly, are crack free, and possess excellent adhesion strength and durability. These silica enhanced alkali silicate solutions provide improved corrosion resistance, but they can be made more corrosion resistant with the addition of nano- and or microparticles, such as calcium carbonate and or zinc oxide. Silicate solutions can react with calcium to form insoluble calcium-silicate compounds. Similarly, zinc oxide has been used to produce silicate coatings that are capable of shedding water. In order to achieve good mixing and dispersion, nano-sized particles of these constituents may be used in the coatings described herein. The large surface area per weight of the nanoparticles helps to maximize silicate glass modification for improved corrosion resistance of the composite.

It has been shown that increasing the silicate ratio, for alkali silicate glass coatings, may lead to cracking in thick coatings.

In an exemplary lab test, a particular amount of cracking was observed in thick 200+ micron silica rich (R=3.22) coatings, whereas little or no cracking was seen in the alkali rich coatings. In the silica rich coating, delamination was observed around the periphery and significant cracking throughout. When this same solution is applied in the appropriate thickness (several microns or less), a much stronger, crack free, fast curable coating can be formed. Such coatings have been applied to copper clad PCB substrates, aluminum and copper metals, and silicon die. These coatings are thin (<2 microns), but can be applied in multiple layers to build up the thickness. It has been observed that even these very thin coatings can provide a rugged moisture barrier at high temperatures (≥450° C.). The corrosion protection of silicate coatings applied to copper clad PCB boards and silicon die have been demonstrated. Also, these coatings can be adapted for strength and durability to prevent tampering and reverse engineering.

When compared with conventional silicon Room Temperature Vulcanizing (RTV) (polymer) coatings, very little oxidation protection is seen while the alkali silicate glass coating provided a hermetic barrier. Also, when properly adapted and applied, these coatings may exhibit high strength and durability to prevent tampering and reverse engineering.

In another exemplary embodiment, silica rich coatings may be applied to wire bonded dies. The purpose of the coatings is to prevent galvanic corrosion at the wire bond/pad interface, a primary failure mechanism in these devices. Preventing this galvanic corrosion leads to significantly greater reliability and can potentially eliminate the need for hermetic packaging.

In an exemplary and non-limiting embodiment, the alkali silicate glass coated wire bond pads may be formed by applying alkali silicate solutions onto chip surfaces then curing at 150° C. Multiple layers may be applied to the coated wire bonds. The result of the coating process has been exemplary shown that the shear strength of coated joints were up to a 25% stronger than uncoated joints. Additionally, pull testing has shown no ball lifts (i.e. there were no separations between ball and pad) in the testing environment.

In addition to thin coatings, composites may be made by mixing the silicate solutions with high thermal conductivity particles such as aluminum nitride, beryllium oxide, diamond, and or metals. These coatings have been found to significantly improve heat transfer when coated over power dissipating devices. For example, thermal improvements in these coated devices are shown in FIG. 2.

Figure 2:
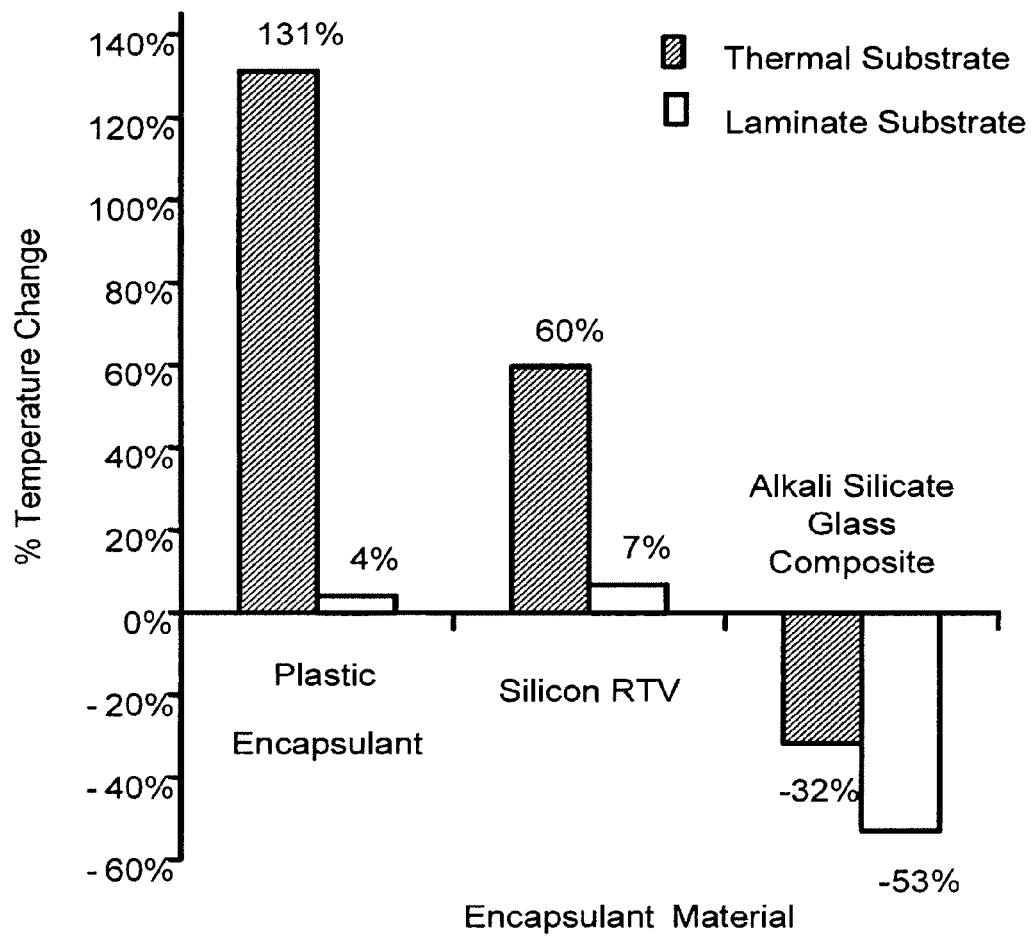
FIG. 2 is an exemplary graph of resultant performance of the thermal properties of alkali silicate glass composites.

Referring to FIG. 2, alkali silicate glass composites have been applied over power dissipating devices mounted on both laminate and copper metal substrates. The resulting package temperatures were reduced by more than 50%, while standard encapsulants caused device temperatures to increase up to 130%.

In a further exemplary embodiment, the addition of nanoparticles to the alkali silicate glass thermal composites provides additional corrosion resistance.

In accordance with exemplary embodiments, numerous ways may be applied in which to provide heat and corrosion resistance to microelectronics packages. These are detailed below and include but are not limited to the following:

Coating bare dies that have been wire bonded or flip chip attached with a coating to form a hermetic glass barrier over the electronics. The coated device could then presumably be encapsulated using standard processing methods. The coating would be a thin layer of glass (≥100 nm) that will provide a hermetic seal to the die and therefore protect it from corrosive elements. For example, FIG. 3 depicts a coating applied to a flip chip and to a wire bonded dies for corrosion and tamper resistance.

It may be particularly desirable to add particles to the coating discussed above to make it opaque and then coating the solution onto a wire bonded or flip chip die. Thus, the coating would provide tamper resistance to the device without exposing it to high processing temperatures. An illustration of this is shown in FIG. 4 which depicts the coating with opaque filler for the tamper resistance of wire bonded and flip chip dies. Alternatively, the solution could also be applied under a flip chip.

Adding high thermal conductivity particles, such as diamond, beryllium oxide, and or aluminum nitride to the coating prior to applying it to a wire bonded or flip chip die. The resulting coating (or paste) over the die may possess a very high thermal conductivity without creating an electrically conductive path and may be applied in conjunction with, or in addition to the high strength and durability of the coating for anti-tampering and reverse engineering prevention or resistance. Thus, hot spots on the die could be easily spread over the entire die surface and conceivably to the boar to which the component is attached and the high durability and strength of the coatings will lead to ant-tampering and anti-reverse engineering properties.

Figure 5:
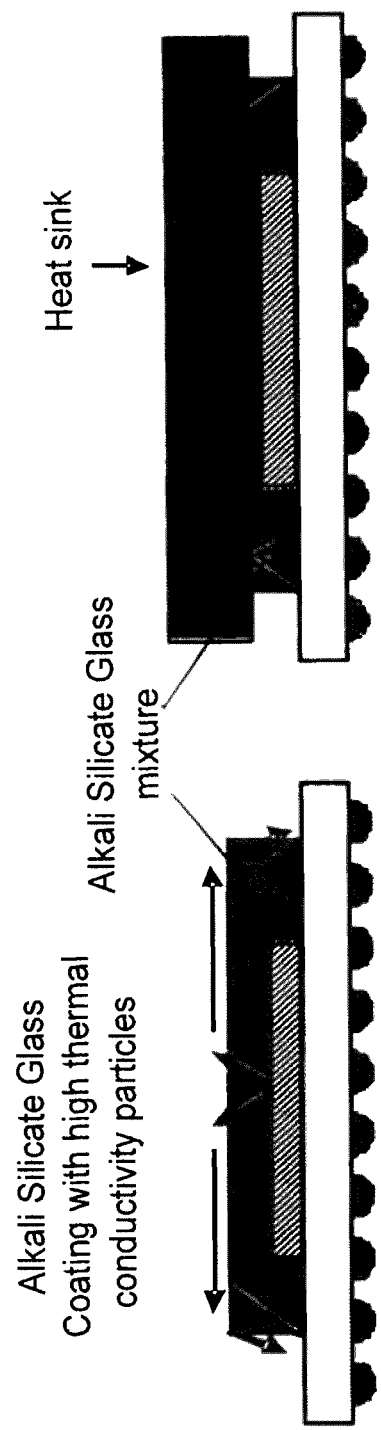

Using high thermal conductivity "filled" coating solution for creating low cost thermal bridges between high temperature components or power dissipating die and thermal sinks. The solution may be applied and cured at low temperature (≤120° C.). Alternatively, to decrease the cure time, it may be desirable cure these coatings at high temperatures that are greater than 120° C. High thermal conductivity particles such as aluminum nitride, beryllium oxide, and or diamond (thermal conductivity near 2000 W/mK) can be used in this application to provide a highly thermally conducting path and may be applied in conjunction with, or in addition to the high strength and durability of the coating for anti-tampering and reverse engineering prevention or resistance. See FIG. 5 for an exemplary illustration.

Figure 6:
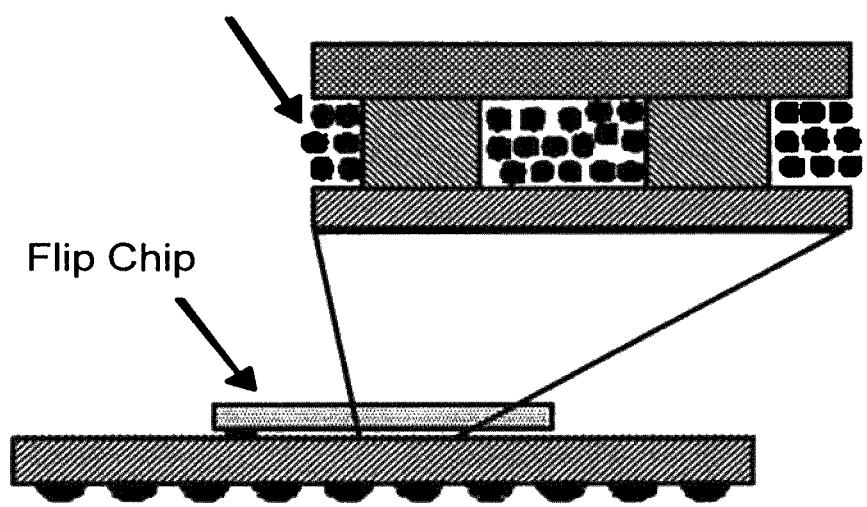

Adding a coefficient of thermal expansion (CTE) matching filler, such as glass or ceramics, to the coating liquid to increase the bond layer thickness so that the solution can be used as an underfill for flip chip devices. This may provide both tamper resistance protection to the die while improving its thermal cycle and shock loading reliability as do many other underfills. Another advantage to this configuration is that these coatings may provide a high-temperature underfill solution (>700° C.). Current underfills are limited to relatively low operating temperatures (≤200° C.). An illustration of this is shown in FIG. 6.

Figure 7:
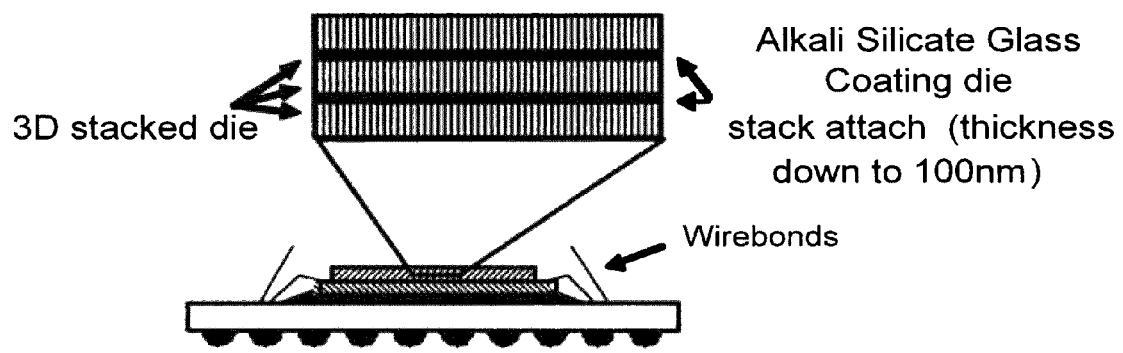

It may also be desirable to use these coatings to create 3D wire bondable or flip chip stacked IC's. These coatings provide a unique high-temperature (>200° C.) solution for chip stacking. The coating bond layer thickness can be made as thin as 100 nm, allowing for the thinnest possible interface formed at low temperature. The coating bonds are very strong and rigid allowing the possibility of wire bonding at higher stack levels without stack compliance (smashing) causing problems. The thinner bonding layers would decrease thermal resistance, thus improving heat transfer. High thermal conductivity particles may also be added to improve heat transfer. The majority of chip or wafer stacking adhesives are not hermetic, which can lead to corrosion and degradation of the bonding interface over time. See FIG. 7, for example. Therefore, because of the high re-melting temperature of the glass coating, disassembly and reverse engineering of the electronic component(s) is rendered more difficult.

Figure 8:
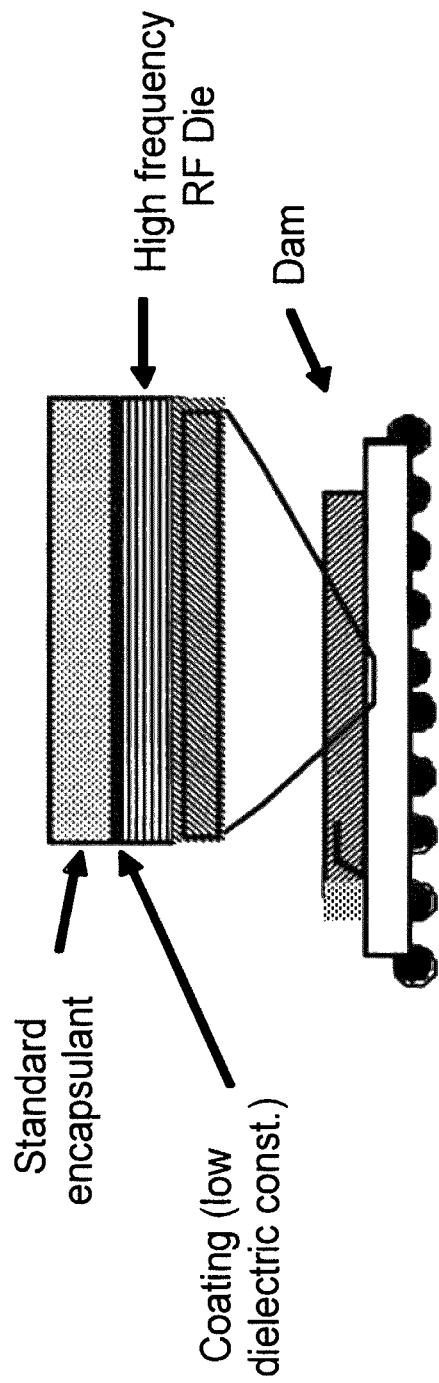

These coatings may also be used for applying over high frequency electronic components to create a low dielectric coating (Er=3 to 10) to improve RF performance. These devices may then be encapsulated using standard methods and encapsulants to improve their reliability and handling characteristics without degrading their electrical performance. Further, by the addition of certain particles, increased durability and hence anti-tampering and anti-reverse engineering properties may be achieved. See FIG. 8 for an example.

As discussed briefly above, in accordance with an exemplary embodiment, micro- and nano-particles can be added to an alkalai silicate solution to make it opaque. The solution can then be coated onto a wirebonded die using a low curing temperature (for example ~110° C.). Once the material has been cured, the material will be nearly impossible to remove without etching or mechanically damaging the underlying integrated circuit. Thus, the wirebonded die will be nearly impossible to remove, due to its exceptional adhering properties or to see through the coating to the die because of the opacity of the coating. The cured alkali silica glass may sufficiently be well bonded to the die such that attempting to remove it from the die will irreversibly damage it. For example, an attempt to dice or cleave the coating would lead to damage of the integrated circuit due to the hardness of the particle fillers contained within the composite. One particular advantage of the glass composites discussed is that they provide reverse engineering and tamper resistance without exposing the device to high curing temperatures.

Figure 10:
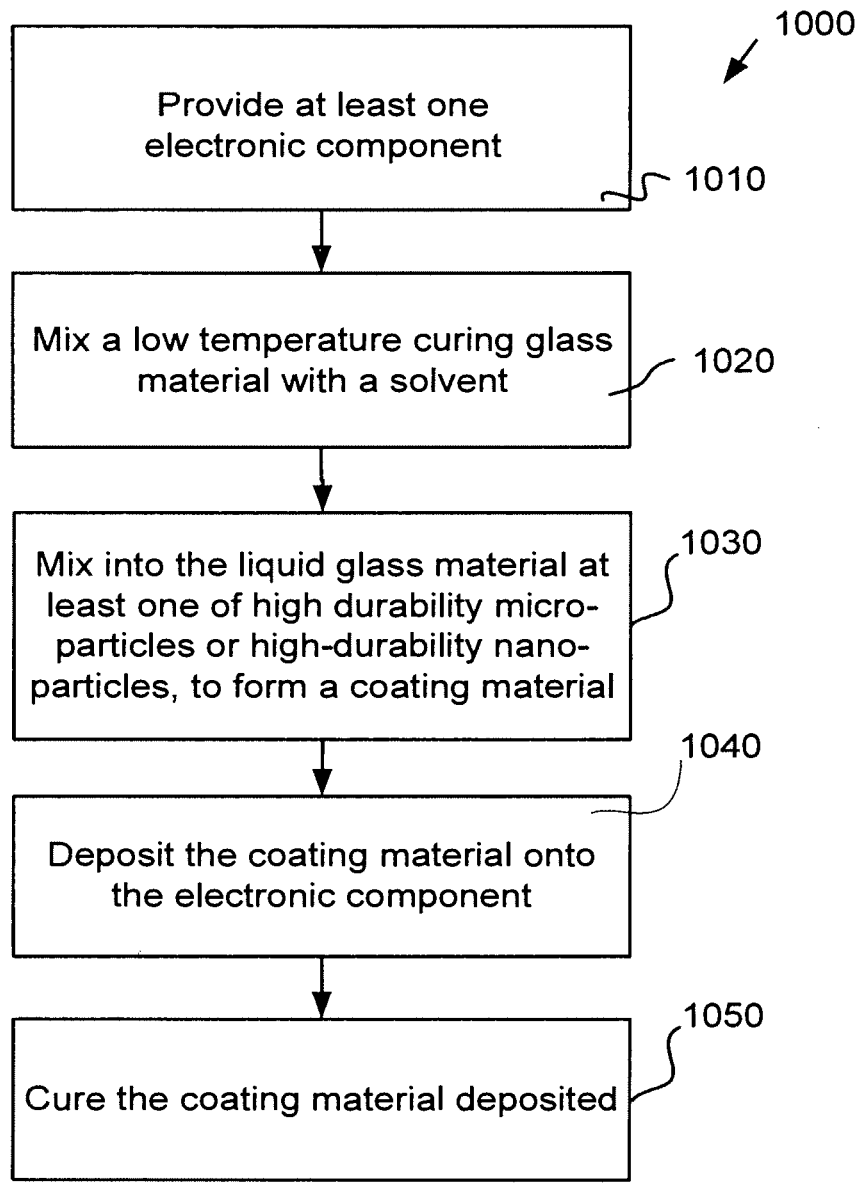
FIG. 10 is an exemplary process diagram in accordance with an exemplary embodiment.

Referring now to FIG. 10, a process 1000 of protecting an electronics package includes providing at least one electronic component that requires protection against tampering and/or reverse engineering as well as other outside factors (process 1010). Process 1000 also includes mixing a low temperature curing glass material with a solvent, to form a liquid glass material (process 1020). In order to change the properties of the coating the process includes mixing into the liquid glass material at least one of high durability micro-particles or high-durability nano-particles, to form a coating material (process 1030). The coating material is deposited onto the electronic component (process 1040). The coating material is then cured to form a hardened coating (process 1050).

Figure 9:
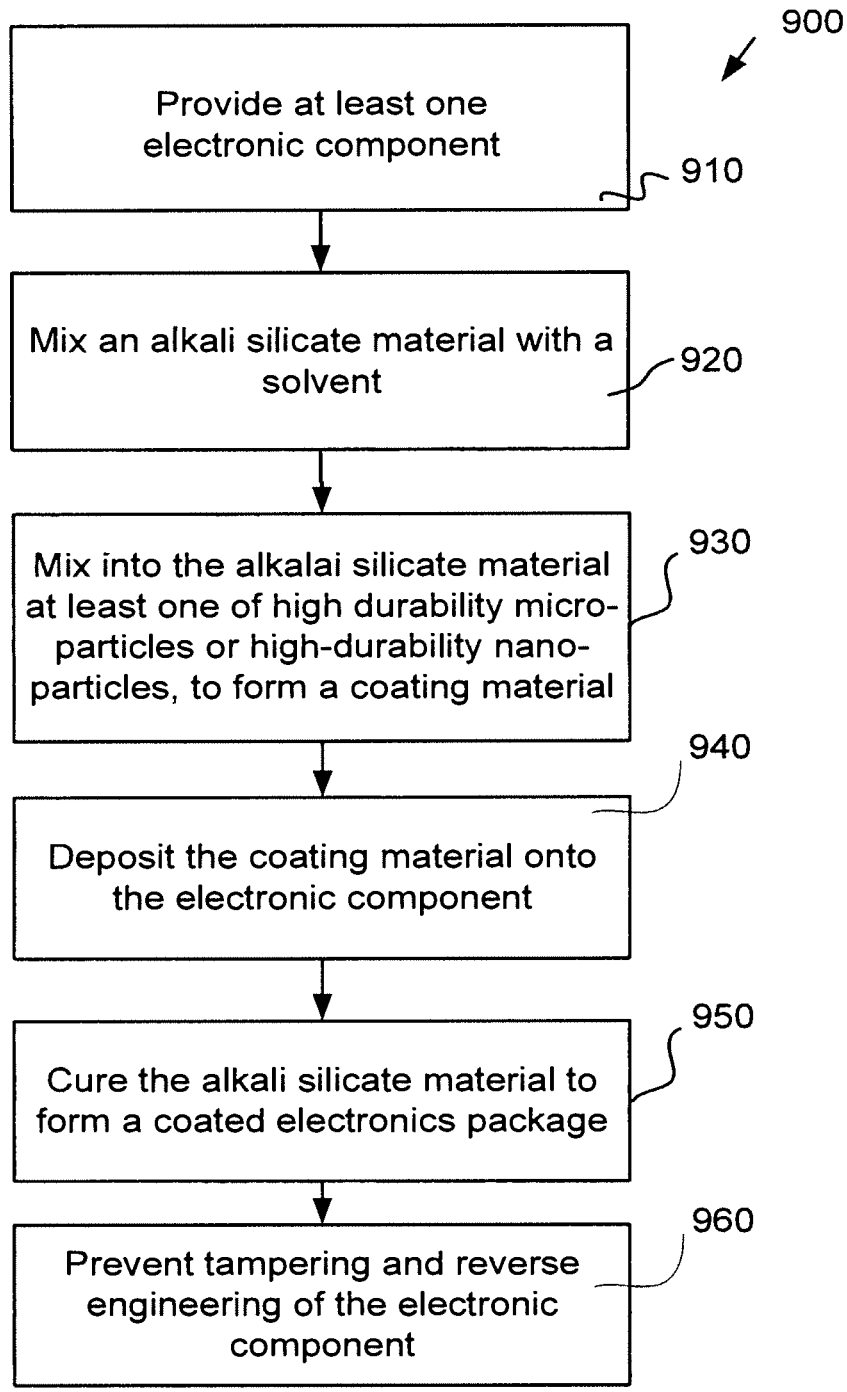
FIG. 9 is an exemplary process diagram in accordance with an exemplary embodiment.

Referring now to FIG. 9, a process for forming a protected electronics package includes providing at least one electronic component that requires protection against tampering and/or reverse engineering as well as other outside factors (process 910). Process 900 also includes mixing an alkali silicate material with a solvent (process 920). Further, process 900 includes mixing into the alkalai silicate material at least one of high durability micro-particles or high-durability nano-particles, to form a coating material (process 930). The coating material is then deposited onto the electronic component (process 940). The alkali silicate material is then deposited to form a coated electronics package (process 950). The coated electronics package resists tampering and reverse engineering of the electronic component (process 960).

While the detailed drawings, specific examples, and particular formulations given described exemplary embodiments, they serve the purpose of illustration only. It should be understood that various alternatives to the embodiments of the invention described may be employed in practicing the invention. It is intended that the following claims define the scope of the invention and that structures within the scope of these claims and their equivalents be covered thereby. The hardware and software configurations shown and described may differ depending on the chosen performance characteristics and physical characteristics of the computing and analysis devices. For example, the type of computing device, communications bus, or processor used may differ. The systems shown and described are not limited to the precise details and conditions disclosed. Method steps provided may not be limited to the order in which they are listed but may be ordered any way as to carry out the inventive process without departing from the scope of the invention. Furthermore, other substitutions, modifications, changes and omissions may be made in the design, operating conditions and arrangements of the exemplary embodiments without departing from the scope of the invention as expressed in the appended claims.

What is claimed is:

1. A method of forming a coated electronic component, comprising:
providing at least one electronic component;
mixing into a liquid silicate glass material at least one of (i) high durability micro-particles and (ii) high-durability nano-particles to form a coating material;
depositing the coating material onto at least a portion of the electronic component; and
curing the coating material deposited.

2. The method of claim 1, wherein the liquid silicate glass material comprises alkali silicate glass.

3. The method of claim 1, further comprising mixing a solvent with the silicate liquid glass material.

4. The method of claim 1, further comprising mixing a solvent with the liquid silicate glass material at a ratio of solvent to glass material of at least 3 to 1.

5. The method of claim 1, further comprising mixing $SiO_2$ and (i) alkali metal carbonate ($M_2CO_3$) or (ii) $M_2O$, wherein M is an alkali metal, to form the silicate glass material.

6. The method of claim 1, wherein the electronic component is a part of an integrated circuit.

7. The method of claim 1, further comprising mixing a solvent comprising water with the liquid silicate glass material.

8. The method of claim 1, wherein the micro-particles or nano-particles are selected from the group consisting of diamond, aluminum nitride, boron nitride, and silicon carbides.

9. The method of claim 1, wherein a portion of the electronic component is a wire bond die or a flip chip die, and the method further comprising depositing the coating material onto the portion.

10. A method of forming a coated electronics package, comprising:
providing at least one electronic component;
mixing an alkali silicate material with a solvent;
mixing into the alkali silicate material at least one of (i) high durability micro-particles and (ii) high-durability nano-particles, to form a coating material;
depositing the coating material onto at least a portion of the electronic component; and
curing the alkali silicate material to form a coated electronics package,
wherein the coated electronics package resists tampering and reverse engineering of the electronic component.

11. The method of claim 10, wherein the alkali silicate material comprises alkali silicate glass.

12. The method of claim 10, wherein the solvent comprises deionized water.

13. The method of claim 10, wherein the curing is carried out at room temperature.

14. The method of claim 10, wherein the curing is carried out at a temperature that is approximately 90° C. to approximately 150° C.

15. The method of claim 10, wherein the micro-particles or nano-particles are selected from the group consisting of high durability ceramics and non-metallics.

16. The method of claim 10, wherein the coating material forms an opaque coating.

17. A method of forming a coated electronic component, comprising:
providing at least one electronic component;

depositing a coating material onto at least a portion of the electronic component; and curing the coating material;

wherein the coating material comprises a liquid alkali silicate glass material and at least one of (i) high durability micro-particles and (ii) high-durability nano-particles.

18. The method of claim 17, further comprising fusing $SiO_2$ and (i) alkali metal carbonate ($M_2CO_3$) or (ii) $M_2O$, wherein M is an alkali metal, to form the alkali silicate glass material.

19. The method of claim 17, further comprising mixing $SiO_2$ and (i) alkali metal carbonate ($M_2CO_3$) or (ii) $M_2O$ at a ratio of $SiO_2$ to (i) or (ii) at greater than or equal to 3.25, wherein M is an alkali metal, to form the alkali silicate glass material.

20. The method of claim 17, further comprising mixing the alkali silicate glass with a water solvent to form the liquid alkali silicate glass material.

* * * * *